(12) United States Patent
Sohn et al.

(10) Patent No.: US 11,581,396 B2
(45) Date of Patent: Feb. 14, 2023

(54) DISPLAY PANEL INCLUDING A SIGNAL LINE HAVING A TWO-LAYER STRUCTURE, AND METHOD FOR MANUFACTURING THE SAME

(71) Applicant: Samsung Display Co., LTD., Yongin-si (KR)

(72) Inventors: Sangwoo Sohn, Yongin-si (KR); Dokeun Song, Seongnam-si (KR); Sukyoung Yang, Hwaseong-si (KR); Dongmin Lee, Anyang-si (KR); Sangwon Shin, Yongin-si (KR); Kyeongsu Ko, Hwaseong-si (KR); Sanggab Kim, Seoul (KR); Hongsick Park, Suwon-si (KR); Hyuneok Shin, Gwacheon-si (KR); Joongeol Lee, Wanju-gun (KR)

(73) Assignee: Samsung Display Co., Ltd., Yongin-si (KR)

( * ) Notice: Subject to any disclaimer, the term of this patent is extended or adjusted under 35 U.S.C. 154(b) by 26 days.

(21) Appl. No.: 17/253,054

(22) PCT Filed: Dec. 20, 2018

(86) PCT No.: PCT/KR2018/016278
§ 371 (c)(1),
(2) Date: Dec. 16, 2020

(87) PCT Pub. No.: WO2020/004746
PCT Pub. Date: Jan. 2, 2020

(65) Prior Publication Data
US 2021/0280666 A1    Sep. 9, 2021

(30) Foreign Application Priority Data
Jun. 27, 2018  (KR) .................. 10-2018-0073862

(51) Int. Cl.
*H01L 29/08* (2006.01)
*H01L 27/32* (2006.01)
(Continued)

(52) U.S. Cl.
CPC ...... *H01L 27/3279* (2013.01); *H01L 27/3262* (2013.01); *H01L 27/3265* (2013.01);
(Continued)

(58) Field of Classification Search
CPC ............. H01L 27/3279; H01L 27/3262; H01L 27/3265; H01L 27/1222; H01L 27/1255;
(Continued)

(56) References Cited

U.S. PATENT DOCUMENTS 7,301,170 B2   11/2007  Cho et al.
7,944,056 B2   5/2011   Chang et al.
(Continued)

FOREIGN PATENT DOCUMENTS

KR   10-2007-0016213 A   2/2007
KR   10-2007-0021086 A   2/2007
(Continued)

OTHER PUBLICATIONS

International Search Report of corresponding PCT/KR2018/016278, dated Mar. 26, 2019, 4 pages.

*Primary Examiner* — Phuc T Dang
(74) *Attorney, Agent, or Firm* — Lewis Roca Rothgerber Christie LLP

(57) ABSTRACT

A display panel includes a base layer, a signal line which is disposed on the base layer and includes a first layer including aluminum and a second layer disposed directly on the first layer and consisting of niobium, a first thin film transistor connected to the signal line, a second thin film transistor disposed on the base layer, a capacitor electrically connected to the second thin film transistor, and a light emitting element electrically connected to the second thin film transistor.

20 Claims, 13 Drawing Sheets

(51) Int. Cl.
  *H01L 51/56* (2006.01)
  *H01L 27/12* (2006.01)
  *H01L 29/66* (2006.01)
  *H01L 29/786* (2006.01)

(52) U.S. Cl.
  CPC ............ *H01L 51/56* (2013.01); *H01L 27/124* (2013.01); *H01L 27/127* (2013.01); *H01L 27/1222* (2013.01); *H01L 27/1255* (2013.01); *H01L 29/66757* (2013.01); *H01L 29/78675* (2013.01); *H01L 2227/323* (2013.01)

(58) Field of Classification Search
  CPC ......... H01L 29/66757; H01L 29/78675; H01L 2227/323
  USPC .......................................................... 257/40
  See application file for complete search history.

(56) References Cited

U.S. PATENT DOCUMENTS

| | | | |
|---|---|---|---|
| 8,247,815 B2 | 8/2012 | Choi et al. | |
| 9,299,757 B2 | 3/2016 | Ko | |
| 9,647,133 B2 | 5/2017 | Pham et al. | |
| 10,332,831 B2 | 6/2019 | Hong et al. | |
| 10,593,670 B2 | 3/2020 | Song et al. | |
| 2005/0285208 A1* | 12/2005 | Ren .................... | H01L 21/28088 257/388 |
| 2007/0111453 A1 | 5/2007 | Lee et al. | |
| 2013/0075732 A1 | 3/2013 | Saito et al. | |
| 2015/0123084 A1* | 5/2015 | Kim .................... | H01L 27/1251 257/43 |
| 2016/0315080 A1* | 10/2016 | Song .................... | H01L 29/513 |
| 2016/0322416 A1* | 11/2016 | Nara .................. | H01L 29/78606 |
| 2017/0025490 A1* | 1/2017 | Sagawa ............... | H01L 27/3262 |
| 2018/0033849 A1* | 2/2018 | Noh .................... | H01L 27/1222 |
| 2018/0069128 A1 | 3/2018 | Shin et al. | |

FOREIGN PATENT DOCUMENTS

| | | |
|---|---|---|
| KR | 10-1061850 B1 | 9/2011 |
| KR | 10-1070761 B1 | 10/2011 |
| KR | 10-2013-0032836 A | 4/2013 |
| KR | 10-1432109 B1 | 8/2014 |
| KR | 10-2015-0051824 A | 5/2015 |
| KR | 10-2015-0092814 A | 8/2015 |
| KR | 10-2015-0108460 A | 9/2015 |
| KR | 10-2016-0126484 A | 11/2016 |
| KR | 10-2017-0026026 A | 3/2017 |
| KR | 10-2018-0063755 A | 6/2018 |

* cited by examiner

[Low Power]    [High Power]

DISPLAY PANEL INCLUDING A SIGNAL LINE HAVING A TWO-LAYER STRUCTURE, AND METHOD FOR MANUFACTURING THE SAME

CROSS-REFERENCE TO RELATED APPLICATIONS

This application is a U.S. National Phase Patent Application of International Application Number PCT/KR2018/016278, filed on Dec. 20, 2018, which claims priority to Korean Patent Application Number 10-2018-0073862, filed on Jun. 27, 2018, the entire content of all of which is incorporated herein by reference.

DESCRIPTION

Technical Field

The present invention relates to a display panel and a method for manufacturing the same and to a display panel, which includes a signal line having a two-layer structure, and a method for manufacturing the same.

Background Art

Display devices include a plurality of signal lines, a plurality of pixels, and driving circuits (for example, a gate driving circuit and a data driving circuit) for controlling the plurality of pixels. Each of the plurality of pixels includes a display element and a pixel driving circuit for controlling the display element. The pixel driving circuit may include a plurality of thin film transistors closely connected to each other.

DISCLOSURE OF THE INVENTION

Technical Problem

The purpose of the present invention is to provide a display panel having an improved signal transmission speed.

The purpose of the present invention is to provide a method for manufacturing a display panel having reduced defects.

Technical Solution

A display panel according to an embodiment of the present invention includes: a base layer; a signal line which is disposed on the base layer; a first thin film transistor connected to the signal line; a second thin film transistor disposed on the base layer; a capacitor electrically connected to the second thin film transistor; and a light emitting element electrically connected to the second thin film transistor. The signal line includes a first layer including aluminum and a second layer disposed directly on the first layer and consisting of niobium.

The first thin film transistor may include: a first polysilicon semiconductor disposed on the base layer; a first control electrode overlapping the first polysilicon semiconductor and connected to the signal line; and a first input electrode and a first output electrode, each being connected to the first polysilicon semiconductor.

The first control electrode may have the same stacked structure as the signal line.

The second thin film transistor may include: a second polysilicon semiconductor disposed on the base layer; a second control electrode overlapping the second polysilicon semiconductor and disposed on a different layer than the first control electrode; and a second input electrode and a second output electrode, each being connected to the second polysilicon semiconductor.

The capacitor may include a first electrode disposed on the same layer as the signal line and a second electrode disposed on the same layer as the second control electrode. The first electrode may have the same stacked structure as the signal line.

Each of the second control electrode and the second electrode may include a first layer including aluminum and a second layer disposed directly on the first layer and consisting of niobium.

The first layer may include an aluminum (Al)-nickel (NO-lanthanum (La) alloy. A content of the nickel to the entire first layer may be 0.01 at % to 0.05 at %, and a content of the lanthanum to the entire first layer may be 0.02 at % to 0.05 at %. A line width of the signal line may be 3 μm to 5 μm.

A thickness of the first layer may be 1000 Å to 2000 Å, and a thickness of the second layer may be 200 Å to 600 Å.

Stress generated in the signal line may be −250 Mpa to −480 Mpa.

The signal line may provide a turn-on signal to the first thin film transistor.

A display panel according to an embodiment of the present invention may include: a base layer; a first thin film transistor disposed on the base layer; a second thin film transistor electrically connected to the first thin film transistor; and a light emitting element connected to the second thin film transistor.

The first thin film transistor may include: a first polysilicon semiconductor disposed on the base layer; a first control electrode overlapping the first polysilicon semiconductor and including a first layer including an aluminum (Al)-nickel (Ni)-lanthanum (La) alloy and a second layer disposed directly on the first layer and consisting of niobium; and a first input electrode and a first output electrode, each connected to the first polysilicon semiconductor.

A method for manufacturing a display panel according to an embodiment of the present invention includes: forming a semiconductor pattern on a base layer; forming a signal line on the base layer; forming, on the base layer, a control electrode overlapping the semiconductor pattern; forming, on the base layer, an input electrode and an output electrode which are connected to the semiconductor pattern; and forming a light emitting element on the base layer. The forming of the signal line includes: forming a first layer including aluminum; forming, directly on the first layer, a second layer consisting of niobium; and patterning the first layer and the second layer.

The first layer may include an aluminum (Al)-nickel (Ni)-lanthanum (La) alloy. A content of the nickel to the entire first layer may be 0.01 at % to 0.05 at %, and a content of the lanthanum to the entire first layer may be 0.02 at % to 0.05 at %.

The semiconductor pattern may include a polysilicon semiconductor. The method may further include doping an area of the polysilicon semiconductor, which does not overlap the control electrode, with an impurity.

The method may further include annealing the polysilicon semiconductor at 400° C. or higher.

The method may further include: forming, on the base layer, an insulating layer configured to cover the polysilicon semiconductor; forming, in the insulating layer, a through-hole that exposes the area of the polysilicon semiconductor which does not overlap the control electrode; and cleaning the area of the polysilicon semiconductor exposed by the through-hole.

The forming of the second layer may be performed through plasma deposition, and the plasma deposition may be performed under deposition conditions with a chamber pressure of 0.16 Pa to 0.2 Pa and a power density of 2.68 W/cm$^2$ to 3.13 W/cm$^2$.

Advantageous Effects

As described above, the resistance of signal line is reduced, and thus, the signal transmission speed is improved. In the high-resolution display panel, the signal delay is reduced.

The first layer of the signal line includes aluminum or the aluminum alloy, and thus, the wire resistance is reduced. For example, the first layer of the signal line includes the aluminum (Al)-nickel (NO-lanthanum (La) alloy, and thus, the hillock phenomenon may be reduced.

The niobium layer is disposed as the second layer directly on the aluminum layer or aluminum alloy layer, and thus, the hillock phenomenon of the signal line may be further reduced. Also, as the cleaning process is performed, the niobium layer may prevent a cleaning solution from reacting with the aluminum layer or aluminum alloy.

MODE FOR CARRYING OUT THE INVENTION

Figure 1:
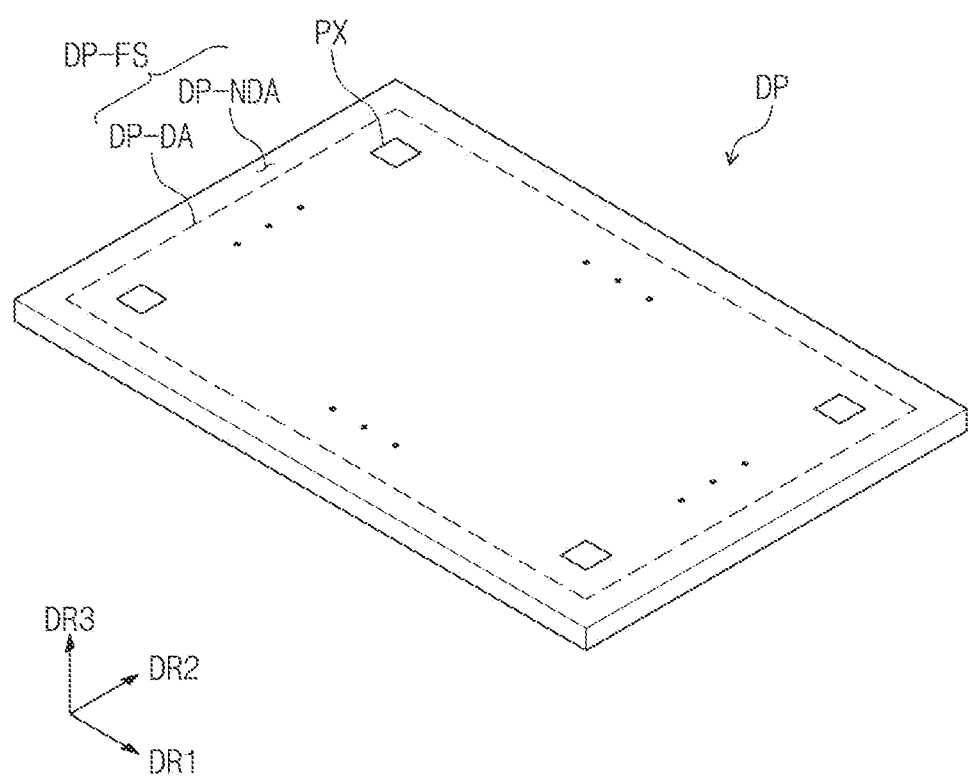
FIG. 1 is a perspective view of a display panel according to an embodiment of the present invention.

Hereinafter, embodiments of the present invention will be described with reference to the accompanying drawings. In this specification, it will also be understood that when a component (a region, a layer, a portion, or the like) is referred to as "being on", "being connected to", or "being coupled to" another component, it may be directly connected/coupled to another component, or an intervening third component may be also disposed therebetween.

Like numbers refer to like elements throughout. Also, in the drawings, the thicknesses, ratios, and dimensions of the elements are exaggerated for effective description of the technical contents. The term "and/or" includes any and all combinations of one or more of the associated listed items.

It will be understood that, although the terms first, second, etc. may be used herein to describe various elements, these elements should not be limited by these terms. These terms are only used to distinguish one element from another element. For example, a first element may be referred to as a second element, and similarly, a second element may be referred to as a first element without departing from the scope of the present invention. The singular forms are intended to include the plural forms as well unless the context clearly indicates otherwise.

Also, terms such as "below", "lower", "above", and "upper" may be used to describe the relationships of the components illustrated in the drawings. These terms have a relative concept, and are described on the basis of the directions indicated in the drawings.

It will be understood that the terms "includes" or "comprises", when used in this specification, specify the presence of stated features, integers, steps, operations, elements, components, or a combination thereof, but do not preclude the presence or addition of one or more other features, integers, steps, operations, elements, components, or combinations thereof.

Figure 2:
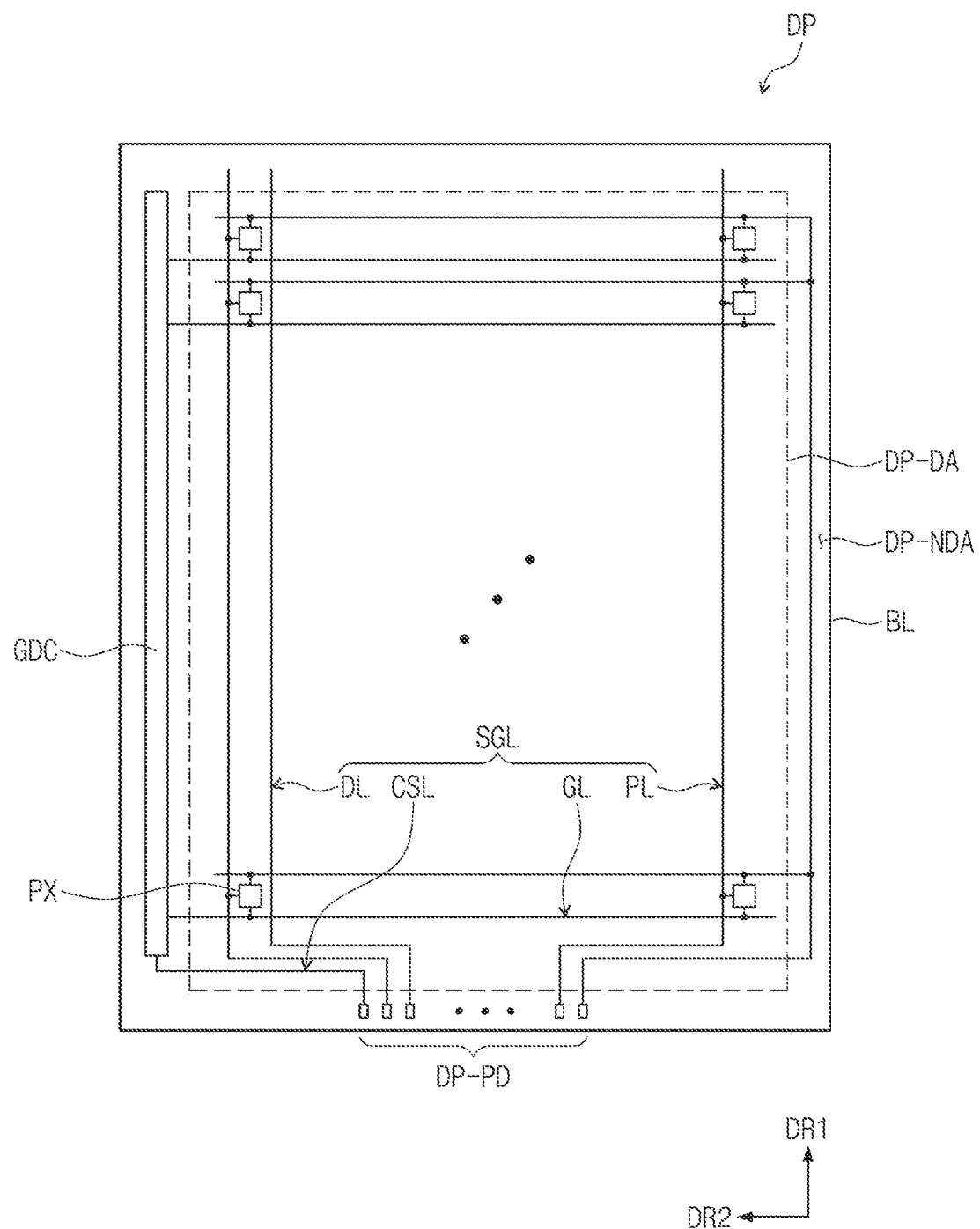
FIG. 2 is a plan view of the display panel according to an embodiment of the present invention.

FIG. 1 is a perspective view of a display panel DP according to an embodiment of the present invention. FIG. 2 is a plan view of the display panel DP according to an embodiment of the present invention. FIG. 2 illustrates a connection relationship between pixels PX, a driving circuit GDC, and signal lines SGL of the display panel DP.

A front surface DP-FS of the display panel DP is parallel to a plane defined by a first directional axis DR1 and a second directional axis DR2. A direction normal to the front surface DP-FS of the display panel DP, that is, a thickness direction of the display panel DP is indicated as a third directional axis DR3. A top surface (or a front surface) and a bottom surface (or a rear surface) of each of layers constituting the display panel DP are distinguished by the third directional axis DR3. Hereinafter, first to third directions are defined as the directions indicated by the first to third directional axes DR1, DR2, and DR3, respectively, and referred to by the same reference symbols.

As illustrated in FIG. 1, the display panel DP includes a display area DP-DA in which the pixels PX are displayed on the front surface DP-FS and a non-display area DP-NDA adjacent to the display area DP-DA. The non-display area DP-NDA is an area in which the pixels PX are not arranged. On the non-display area DP-NDA, a portion of signal lines SGL and/or the driving circuit GDC are arranged.

As illustrated in FIG. 1, the display area DP-DA may have a quadrangular shape. The non-display area DP-NDA may surround the display area DP-DA. However, embodiments are not limited thereto, and the shape of the display area DP-DA and the shape of the non-display area DP-NDA may be relatively designed. For example, the non-display area DP-NDA may be disposed only in areas facing each other in the first direction DR1. The display area DP-DA may have a circular shape.

As illustrated in FIG. 2, the display panel DP may include a driving circuit GDC, a plurality of signal lines SGL (hereinafter, referred to as signal lines SGL), a plurality of signal pads DP-PD (hereinafter, referred to as signal pads), and a plurality of pixels PX (hereinafter, referred to as pixels).

The pixels PX may be divided into a plurality of groups according to displayed colors. The pixels PX may include, for example, red pixels, green pixels, and blue pixels. The pixels PX may further include white pixels. A pixel driving circuit may be common although the pixels PX are divided into different groups according to the display colors.

The driving circuit GDC may include a gate driving circuit. The gate driving circuit generates a plurality of gate signals (hereinafter, referred to as gate signals) and sequentially outputs the gate signals to a plurality of gate lines GL (hereinafter, gate lines) which will be described later. The gate driving circuit may further output other control signals to the driving circuit of the pixels PX.

The gate driving circuit may include a plurality of thin film transistors which are formed by the same process as the driving circuit of the pixels PX, such as by a low temperature polycrystalline silicon (LTPS) process or by a low temperature polycrystalline oxide (LTPO) process.

The signal lines SGL include gate lines GL, data lines DL, a power line PL, and a control signal line CSL. Each of the gate lines GL is connected to a corresponding pixel PX of the pixels PX, and each of the data lines DL is connected to a corresponding pixel PX of the pixels PX. The power line PL is connected to the pixels PX. The control signal line CSL may provide control signals to the gate driving circuit. Each of the signal pads DR-PD is connected to a corresponding signal line of the signal lines SGL. Although not separately illustrated, the signal lines SGL may further include light emitting signal lines.

In some embodiments, each of the pixels PX may be a light emitting pixel. For example, the pixel PX may include an organic light emitting diode or a quantum dot light emitting diode as a light emitting element. A light emitting layer of the organic light emitting diode may include an organic light emitting material. A light emitting layer of the quantum-dot light emitting diode may include a quantum dot, a quantum rod, and/or the like. Hereinafter, the pixel PX may be described as an organic light emitting pixel.

The pixel PX includes an organic light emitting diode or a quantum dot light emitting diode and a pixel driving circuit for driving the organic light emitting diode or a quantum dot light emitting diode. The organic light emitting diode may be a front-light emitting diode or a rear-light emitting diode. The pixel driving circuit includes at least a switching thin film transistor, a driving thin film transistor, and a capacitor. A high-power voltage is provided to the driving thin film transistor, and a low-power voltage is applied to one electrode of the organic light emitting diode. The driving thin film transistor corresponds to an amount of electric charge stored in the capacitor and controls driving current that flows through the organic light emitting diode. The switching thin film transistor responds to the gate signal applied to the gate line and outputs a data signal applied to the data line. The capacitor charges a voltage corresponding to the data signal received from the switching thin film transistor.

Figure 3:
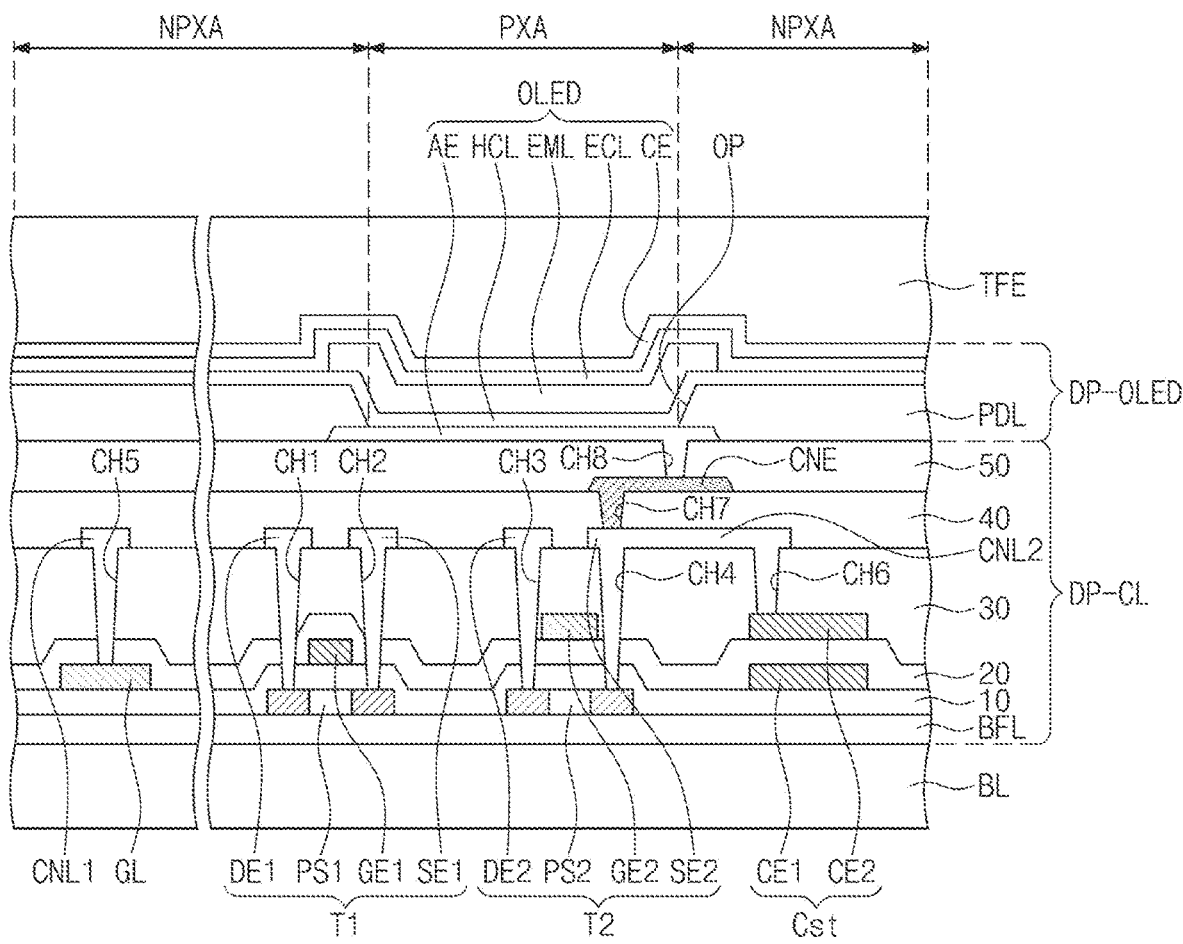
FIG. 3 is a cross-sectional view corresponding to a portion of a pixel in the display panel according to an embodiment of the present invention.

The pixel driving circuit includes the switching thin film transistor and the driving thin film transistor and may include, for example, six or seven thin film transistors. The configuration of the pixel driving circuit is not particularly limited. According to the configuration of the pixel driving circuit, design of the signal lines SGL may also be modified, FIG. 3 is a cross-sectional view corresponding to a portion of a pixel PX according to an embodiment of the present invention. FIG. 3 illustrates a cross-sectional view which, as a partial configuration of the pixel PX, corresponds to a switching thin film transistor T1 (hereinafter, referred to as a first thin film transistor), a driving thin film transistor T2 (hereinafter, referred to as a second thin film transistor), a capacitor Cst, and an organic light emitting diode OLED. Also, a cross-sectional view of a gate line GL is additionally illustrated.

As illustrated in FIG. 3, a display panel DP includes a base layer BL, a circuit element layer DP-CL disposed on the base layer BL, a display element layer DP-OLED, and a thin film encapsulation layer TFE. In an embodiment of the present invention, the thin film encapsulation layer TFE may be replaced with an encapsulation substrate, for example, a metal substrate or a glass substrate. The display panel DP may further include functional layers such as an anti-reflection layer and a refractive index adjusting layer. The circuit element layer DP-CL includes at least a plurality of insulating layers and circuit elements. Hereinafter, the insulating layers may include an organic layer and/or an inorganic layer.

The circuit elements include a signal line, a driving circuit of a pixel, and the like. The circuit element layer DP-CL may be formed through a process for forming an insulating layer, a semiconductor layer, and a conductive layer using coating, deposition, and the like and a process for pattering an insulating layer, a semiconductor layer, and a conductive layer using a photolithography process. The display element layer DP-OLED includes a light emitting element. The light emitting element layer DP-OLED may further include an organic layer such as a pixel defining layer PDL.

The base layer BL may include a synthetic resin film or layer. The synthetic resin layer may include thermosetting resin. In some embodiments, the synthetic resin layer may be a polyimide-based resin layer, but the material thereof is not particularly limited. The synthetic resin layer may include at least one of an acryl-based resin, a methacryl-based resin, polyisoprene, a vinyl-based resin, an epoxy-based resin, a urethane-based resin, a cellulose-based resin, a siloxane-based resin, a polyamide-based resin, or a perylene-based resin. In addition, the base layer BL may include a glass substrate, a metal substrate, an organic/inorganic composite material substrate, and/or the like.

At least one inorganic layer is formed on the top surface of a base layer BL. The inorganic layer may include at least one of an aluminum oxide, a titanium oxide, a silicon oxide, a silicon oxynitride, a zirconium oxide, or a hafnium oxide. The inorganic layer may be formed as a multi-layer. The multi-layered inorganic layer may constitute a buffer layer BFL. The buffer layer BFL may prevent foreign substances from being introduced from the outside. Also, the buffer layer BFL improves a bonding force, compared to conductive patterns or semiconductor patterns formed directly on the base layer BL.

On the buffer layer BFL, a first semiconductor pattern PS1 and a second semiconductor pattern PS2 are disposed. Each of the first semiconductor pattern PS1 and the second semiconductor pattern PS2 may include a polysilicon semiconductor. However, the embodiment is not limited thereto, and each of the first semiconductor pattern PS1 and the second semiconductor pattern PS2 may include a polysilicon semiconductor, amorphous silicon, and/or an oxide semiconductor in the same or different amounts.

Each of the first semiconductor pattern PS1 and the second semiconductor pattern PS2 may include an input area (or a first portion), an output area (or a second portion), and a channel area (or a third portion) defined between the input area and the output area. The channel area of the first semiconductor pattern PS1 may be defined corresponding to a first control electrode GE1 which will be described later, and the channel area of the second semiconductor pattern PS2 may be defined corresponding to a second control electrode GE2 which will be described later. The input area and the output area are doped with dopants and thus have relatively high conductivity, compared to the channel area. The input area and the output area may be doped with n-type dopants. In some embodiments, the n-type first thin film transistor T1 and the n-type second semiconductor pattern PS2 are described as examples, but the first thin film transistor T1 and the second semiconductor pattern PS2 may be p-type transistors and may be doped with different dopants.

A first insulating layer 10 may be disposed on the buffer layer BFL. The first insulating layer 10 overlaps the plurality of pixels PX (see FIGS. 1 and 2) in common and covers the first semiconductor pattern PS1 and the second semiconductor pattern PS2. The first insulating layer 10 may be an inorganic layer and/or an organic layer and may have a single-layer or multi-layered structure.

The first control electrode GE1 is disposed on the first insulating layer 10. The first control electrode GE1 overlaps the channel area of the first semiconductor pattern PS1. The gate line GL and a first electrode CE1 of the capacitor Cst are disposed on the first insulating layer 10. The first control electrode GE1, the gate line GL, and the first electrode CE1 may be formed through the same process and thus have the same stacked structure. Although not illustrated in FIG. 3, the first control electrode GE1 is connected to the gate line GL in a plan view. The gate line GL provides a turn-on signal to the first thin film transistor T1.

A second insulating layer 20 for covering the first control electrode GE1, the gate line GL, and the first electrode CE1 is disposed on the first insulating layer 10. The second insulating layer 20 overlaps the plurality of pixels PX in common. The second insulating layer 20 may be an inorganic layer and/or an organic layer and may have a single-layer or multi-layered structure.

The second control electrode GE2 may be disposed on the second insulating layer 20. The second control electrode GE2 overlaps the channel area of the second semiconductor pattern PS2. A second electrode CE2 of the capacitor Cst may be disposed on the second insulating layer 20. The second control electrode GE2 the and the second electrode CE2 may be formed through the same process and thus have the same stacked structure. In some embodiments of the present invention, the second control electrode GE2 may be disposed on the same layer as the first control electrode GE1.

A third insulating layer 30 for covering the second control electrode GE2 and the second electrode CE2 is disposed on the second insulating layer 20. The third insulating layer 30 may be an inorganic layer and/or an organic layer and may have a single-layer or multi-layered structure. The first insulating layer 10 to the third insulating layer 30 may include at least one of an aluminum oxide, a titanium oxide, a silicon oxide, a silicon oxynitride, a zirconium oxide, or a hafnium oxide. In the illustrated embodiment, the third insulating layer 30 may be a single-layered silicon oxide layer.

On the third insulating layer 30, connection signal lines and input and/or output electrodes may be disposed. On the third insulating layer 30, a first input electrode DE1 and a first output electrode SE1 are disposed, which are connected to the input area and the output area of the first semiconductor pattern PS1, respectively, through a first through-hole CH1 and a second through-hole CH2. On the third insulating layer 30, a second input electrode DE2 and a second output electrode SE2 are disposed, which are connected to the input area and the output area of the second semiconductor pattern PS2, respectively, through a third through-hole CH3 and a fourth through-hole CH4. The first through-hole CH1 to the fourth through-hole CH4 pass through the first to third insulating layers 10 to 30.

A first connection signal line CNL1 and a second connection signal line CNL2 are disposed on the third insulating layer 30. The first connection signal line CNL1 is connected to the gate line GL through a fifth through-hole CH5, and the second connection signal line CNL2 is connected to the second electrode CE2 through a sixth through-hole CH6. The first connection signal line CNL1 may be connected to another thin film transistor (not shown) of the pixel driving circuit.

On the third insulating layer 30, a fourth insulating layer 40 is disposed, which covers the connection signal lines and input and/or output electrodes DE1, DE2, SE1, SE2. The material of the fourth insulating layer 40 is not particularly limited. A connection electrode CNE is disposed on the fourth insulating layer 40. The connection electrode CNE may be connected directly or indirectly to the second output electrode SE2 through a seventh contact hole CH7 that passes through the fourth insulating layer 40 (or, in some embodiments, the connection electrode CNE may be electrically connected to the second output electrode SE2 via another connection signal line). A fifth insulating layer 50 (or a passivation layer) for covering the connection electrode CNE may be disposed on the fourth insulating layer 40. The fifth insulating layer 50 may be an organic layer and may have a single-layer or multi-layered structure.

In some embodiments, each of the fourth insulating layer 40 and the fifth insulating layer 50 may be a single-layered polyamide-based resin layer. Embodiments are not limited thereto, and each of the fourth insulating layer 40 and the fifth insulating layer 50 may include at least one of an acryl-based resin, a methacryl-based resin, polyisoprene, a vinyl-based resin, an epoxy-based resin, a urethane-based resin, a cellulose-based resin, a siloxane-based resin, a polyamide-based resin, or a perylene-based resin.

The organic light emitting diode OLED is disposed on the fifth insulating layer 50. An anode AE of the organic light emitting diode OLED may be disposed on the fifth insulating layer 50. The anode AE is connected to the connection electrode CNE through an eighth contact hole CH8 that passes through the fifth insulating layer 50. The pixel defining layer PDL is disposed on the fifth insulating layer 50.

An opening portion OP of the pixel defining layer PDL allows at least a portion of the anode AE to be exposed. The opening portion OP of the pixel defining layer PDL may define a light emitting area PXA of a pixel. For example, the plurality of pixels PX (see FIG. 1) may be arranged in a certain form on a plane of the display panel DP (see FIG. 1). An area in which the plurality of pixels PX are disposed may be defined as a pixel area, and one pixel area may include a light emitting area PXA and a non-light emitting area NPXA adjacent to the light emitting area PXA. The non-light emitting area NPXA may surround the light emitting area PXA.

A hole control layer HCL may be disposed in common in the light emitting area PXA and the non-light emitting area NPXA. A common layer such as the hole control layer HCL may be formed in common in the plurality of pixels PX (see FIGS. 1 and 2). The hole control layer HCL may include a hole transport layer and a hole injection layer.

An organic light emitting layer EML is disposed on the hole control layer HCL. The organic light emitting layer EML may be disposed only in an area corresponding to the opening portion OP. That is, organic light emitting layers EML of the plurality of pixels PX may have boundaries with each other.

In the illustrated embodiment, the patterned organic light emitting layer EML is shown, but the organic light emitting layer EML may be disposed in common in the plurality of pixels PX. Here, the organic light emitting layer EML may generate white light or blue light. Also, the organic light emitting layer E 61L may have a multi-layered structure.

An electron control layer ECL is disposed on the organic light emitting layer EML. The electron control layer ECL may include an electron transport layer and an electron injection layer. A cathode CE is disposed on the electron control layer ECL. The electron control layer ECL and the cathode CE may be disposed in common in the plurality of pixels PX.

The thin film encapsulation layer TFE is disposed on the cathode CE. The thin film encapsulation layer TFE is disposed in common in the plurality of pixels PX. In the illustrated embodiment, the thin film encapsulation layer TFE directly covers the cathode CE. In some embodiments of the present invention, a capping layer for the cathode CE may be further disposed. In some embodiments of the present invention, a stacked structure of the organic light emitting diode OLED may be vertically inverted from the structure illustrated in FIG.

The thin film encapsulation layer TFE includes at least an inorganic layer or an organic layer. In some embodiments of the present invention, the thin film encapsulation layer TFE may include two inorganic layers and an organic layer disposed therebetween. In some embodiments of the present invention, the thin film encapsulation layer may include a plurality of inorganic layers and a plurality of organic layers which are alternately stacked.

An encapsulation inorganic layer protects the organic light emitting diode OLED against moisture/oxygen, and an encapsulation organic layer protects the organic light emitting diode OLED against impurities such as dust particles. The encapsulation inorganic layer may include, but is not limited to, a silicon nitride layer, a silicon oxynitride layer, a silicon oxide layer, a titanium oxide layer, or an aluminum oxide layer. The encapsulation organic layer may include, but is not limited to, an acrylic-based organic layer.

Unlike that illustrated in FIG. 3, the fourth insulating layer 40 and the connection electrode CNE may be omitted in some embodiments of the present invention. The first insulating layer 50 may cover the second output electrode SE2, and the anode AE may be directly or indirectly to the second output electrode SE2. According to such embodiments, the second thin film transistor T2 and the organic light emitting diode OLED are directly connected to each other as an equivalent circuit. However, the present invention is not limited thereto. In some embodiments of the present invention, another thin film transistor may be further disposed between the second thin film transistor T2 and the organic light emitting diode OLED as an equivalent circuit.

Figure 4A:
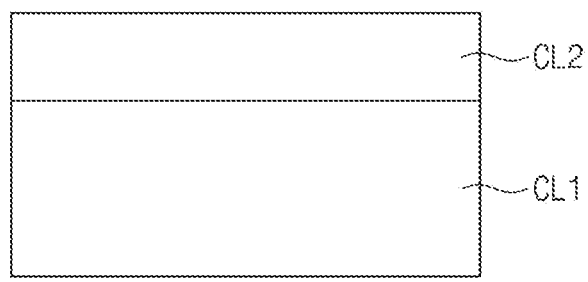
FIG. 4A is a view illustrating a cross-section of a signal line according to an embodiment of the present invention.
Figure 4B:
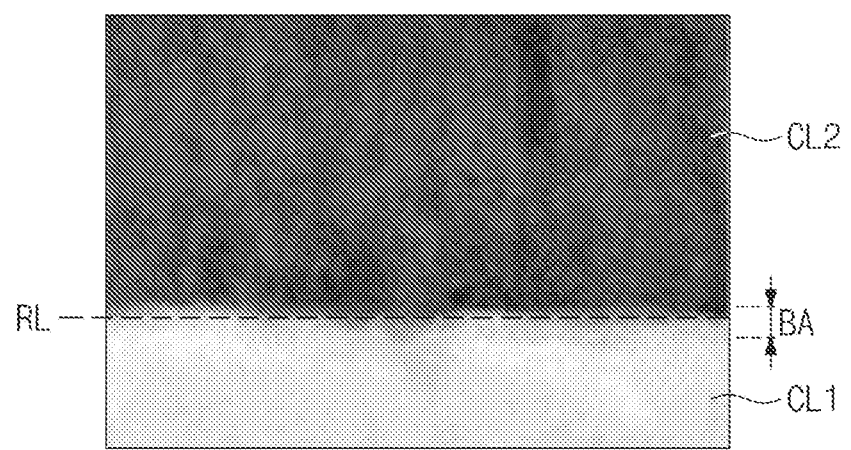
FIG. 4B is a picture illustrating a portion of a cross-section of a signal line according to an embodiment of the present invention.
Figure 4C:
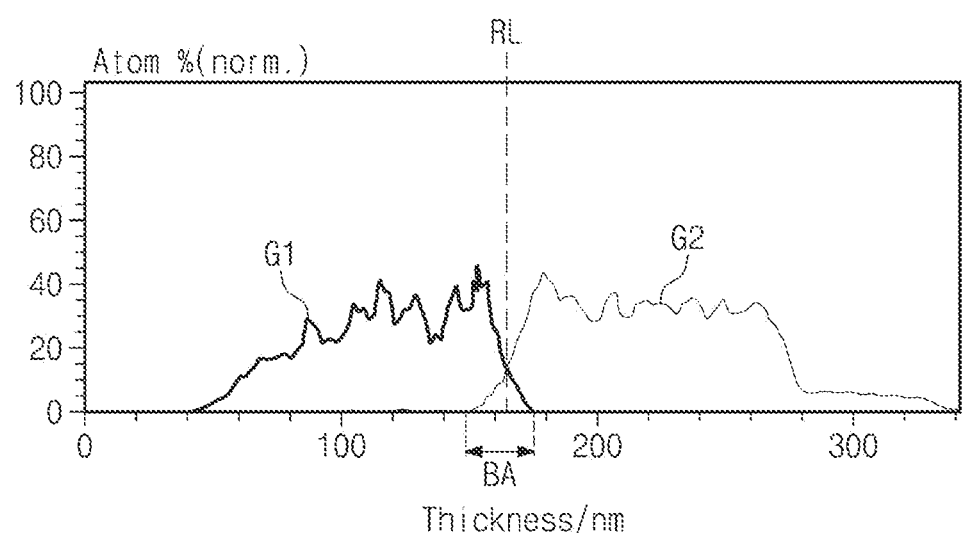
FIG. 4C is a line graph illustrating a change in atom content in a cross-section of a signal line according to an embodiment of the present invention.
Figure 4D:
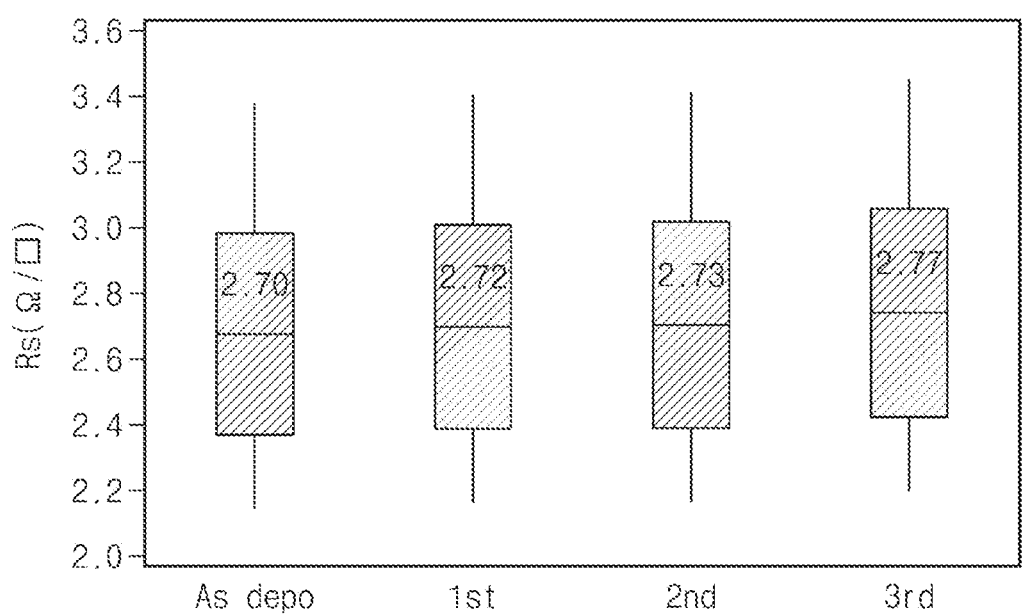
FIG. 4D is a bar graph illustrating a change in resistance due to a cleaning process in a signal line according to an embodiment of the present invention.
Figure 4E:
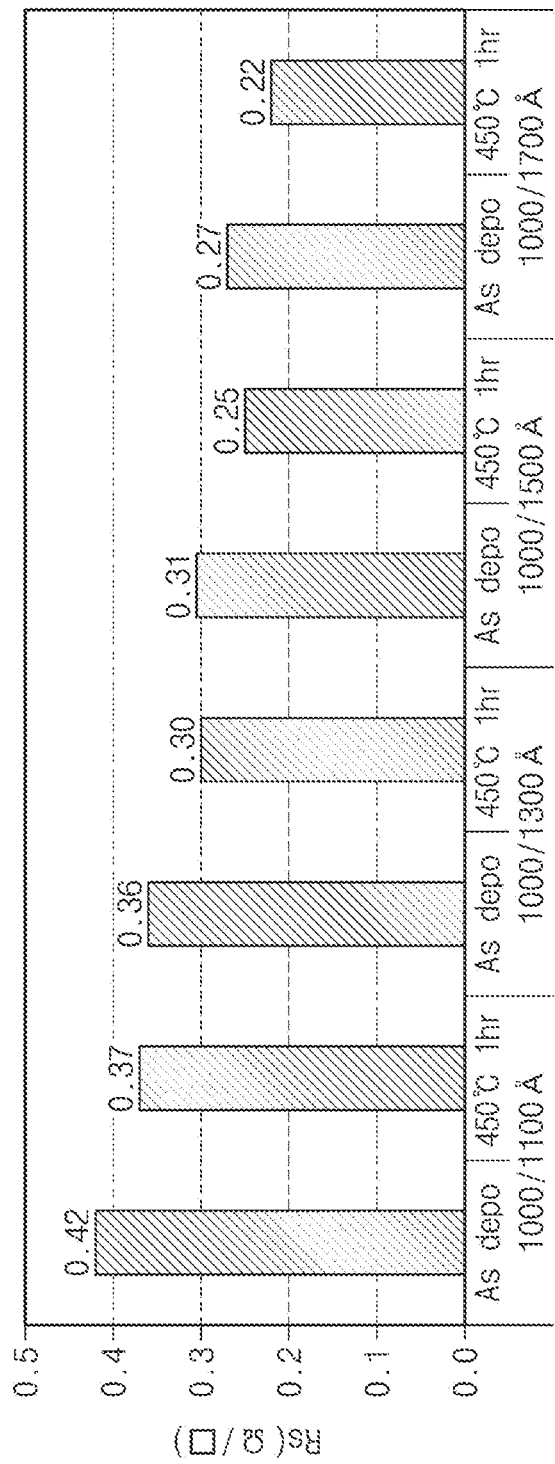
FIG. 4E is a bar graph illustrating a change in resistance due to a heat treatment process in a signal line according to an embodiment of the present invention.

FIG. 4A is a view illustrating a cross-section of a signal line CL according to an embodiment of the present invention. FIG. 4B is a picture illustrating a cross-section of the signal line CL according to an embodiment of the present invention. FIG. 4C is a line graph illustrating a change in atom content in a cross-section of the signal line CL according to an embodiment of the present invention. FIG. 4D is a bar graph illustrating a change in resistance due to a cleaning process in a signal line according to an embodiment of the present invention. FIG. 4E is a bar graph illustrating a change in resistance due to a heat treatment process in a signal line according to an embodiment of the present invention.

In the illustrated embodiment, a signal line CL illustrated in FIG. 4A may be at least the gate line GL illustrated in FIG. 3. The signal line CL may have a two-layer stacked structure. The signal line CL may include a first layer CL1 including aluminum and a second layer CL2 disposed directly on (or being in contact with) the first layer CL1 and consisting of niobium.

Because the first layer CL1 includes aluminum, wire resistance thereof is reduced compared to existing molybdenum wires. In a metal wire, a thickness is increased to reduce resistance. But, when increased above a reference thickness, tensile stress is increased which may cause damage to the base layer BL (see FIG. 3), such as through bending or breaking. The signal line CL including aluminum may be designed with a relatively small thickness, and as a result, damage of the base layer BL may be reduced or prevented.

The first layer CL may include an aluminum (Al)-nickel (Ni)-lanthanum (La) alloy. Accordingly, the hillock phenomenon of the signal line CL may be reduced. In an aluminum wire, a phenomenon, called the hillock phenomenon, may occur when the aluminum wire is exposed to high temperatures, causing the surface to expand and resistance to increase. However, in the alloy described above, the occurrence of the phenomenon is reduced. This is possible because nickel (Ni) and lanthanum (La) improve thermal resistance of the signal line CL. Here, when the content of nickel (Ni) and lanthanum (La) exceeds a reference value, a defect may occur upon dry etching.

A content of aluminum in the entire first layer CL1 may be 99.90 at % to 99.99 at %. A content of nickel in the entire first layer CL1 may be 0.01 at % to 0.05 at %, and a content of lanthanum in the entire first layer is 0.02 at % to 0.05 at %. A composition of the aluminum alloy may be checked through ICP, XPS, and SIMS. A thickness of the first layer CL1 may be 1000 Å to 2000 Å. When a thickness of the first layer CL1 is less than 1000 Å, the resistance becomes high. When greater than 2000 Å, manufacturing cost is increased. Thus, patterning may not be clearly made during an etching process, or a large amount of time may be consumed during the etching process.

The second layer CL2 is disposed directly on the first layer CL1, and thus, the hillock phenomenon of the signal line CL may be further reduced. This is possible because the second layer CL2 covers the top surface of the first layer CL1 and removes a space at which the first layer CL could be expanded.

A thickness of the second layer CL may be 200 Å to 600 Å. As described later, it is desirable that the thickness of the second layer CL2 is greater than 200 Å when considering a thickness of a boundary layer. When the thickness of the second layer CL2 is too high, patterning may not be clearly made during an etching process, or a large amount of time may be consumed during the etching process. Thus, it is desirable to be less than 600 Å. The thickness of each layer may be checked through TEM or FIB.

Also, a cleaning process is performed during a manufacturing process for a display panel. The second layer CL2 may prevent a cleaning solution from reacting with the first layer. This will be described later in detail with reference to FIG. 5H.

FIG. 4D illustrates resistance values (1st, 2nd, and 3rd) of the signal line CL after the cleaning process is performed, compared to a resistance value (As depo) of the signal line CL on which the cleaning process is not performed. It may be found that there is no significant change between the resistance values (1st, 2nd, and 3rd) of a signal line CL on which the cleaning process is performed one to three times and the resistance value (As depo) of the signal line CL on which the cleaning process is not performed. This is because the first layer CL1 is protected from the cleaning solution by the second layer CL2.

Although a niobium layer CL2 is disposed directly on an aluminum layer CL1, an amount of atom diffusion on an interface is low. Thus, an increase in resistance of the signal line CL may be minimized. Referring to FIG. 4B, it may be found that niobium atoms and aluminum atoms are diffused in a boundary area BA to form an alloy. Referring to FIG. 4C, a first graph G1 indicates an atom content of niobium, and a second graph G2 indicates an atom content of aluminum. A reference line RL is an interface between the niobium layer CL2 and the aluminum layer CL1 when it is assumed that there is no atom diffusion (or right after deposition is finished). A thickness of the boundary area BA may be 120 Å to 170 Å. In the graph, the thickness of the boundary area BA is measured to be 152 Å.

Also, a heat treatment process is performed during the manufacturing process for the display panel. FIG. 4E illustrates a resistance value (450° C. 1 hr) of the two-layered signal line CL after the heat treatment process is performed, compared to a resistance value (As depo) of the signal line CL on which the heat treatment process is not performed. This is performed on four samples, and measurement is made while changing a thickness of the first layer CL1. In all four samples, it may be found that resistance of the signal line CL is reduced due to the heat treatment. As described with reference to FIGS. 4B to 4D, this finding is a result of there being little diffusion between the niobium atoms and aluminum atoms, and a grain size of the aluminum layer is increased due to the heat treatment.

A line width of the signal line CL having the two-layer stack structure may be 3 μm to 5 μm. In a high-resolution product, a short circuit failure of a pixel driving circuit may occur because a gap between the pixels is small. To prevent the above failure, the line width has the above range.

In an embodiment of the present invention, a conductive pattern formed through the same process as the gate line GL illustrated in FIG. 3 may have the same stacked structure as the signal line CL illustrated in FIG. 4A. For example, the first control electrode GE1 (see FIG. 3) and the first electrode CE1 may have the same stacked structure as the gate line GL having a two-layer structure.

In some embodiments of the present invention, the signal line CL illustrated in FIG. 4A may be a connection signal line for connecting a conductive pattern and a conductive pattern. The connection signal line is not illustrated in the cross-section of FIG. 4A, but is formed to realize a pixel driving circuit. For example, the connection signal line may connect thin film transistors to each other.

The connection signal line may be disposed on the second insulating layer 20, and may have the same stacked structure as the signal line CL illustrated in FIG. 4A. Also, a conductive pattern formed through the same process as the relevant connection signal line may have the same stacked structure as the signal line CL illustrated in FIG. 4A. The second control electrode GE2 (see FIG. 3) and the second electrode CE2 may have the same stacked structure as a connection signal line (not shown) disposed on the second insulating layer 20.

FIGS. 5A, 5B and 5F to 5J are cross-sectional views illustrating a method for manufacturing a display panel DP according to an embodiment of the present invention. Each of FIGS. 5A, 5B and 5F to 5J illustrates an area corresponding to FIG. 3 in a comparison manner. Hereinafter, detailed descriptions of the same components as those described with reference to FIGS. 1 to 4E will be omitted.

Figure 5A:
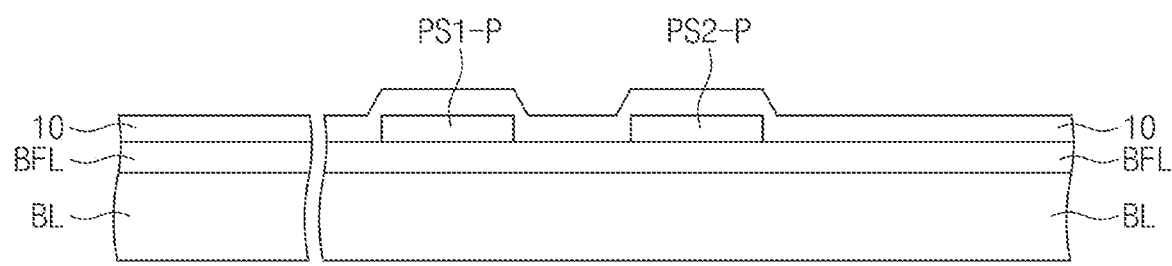
FIGS. 5A to 5B are cross-sectional views illustrating a method of manufacturing a display panel according to an embodiment of the present invention.

As illustrated in FIG. 5A, an inorganic layer is formed on a base layer BL. Inorganic layers may be formed by depositing inorganic materials. For example, a buffer layer BFL may be formed by sequentially forming a silicon oxide layer and a silicon nitride layer.

As illustrated in FIG. 5A, a first preliminary semiconductor pattern PS1-P and a second preliminary semiconductor pattern PS2-P are formed on the buffer layer BFL. The first preliminary semiconductor pattern PS1-P and the second preliminary semiconductor pattern PS2-P are formed by forming and patterning semiconductor layers. The semiconductor layers may be crystallized before and/or after patterning.

As illustrated in FIG. 5A, a first insulating layer 10 is formed on the buffer layer BFL. The first insulating layer 10 may be formed through deposition, coating, or printing. A forming method may be appropriately selected according to a material of the first insulating layer 10.

Figure 5B:
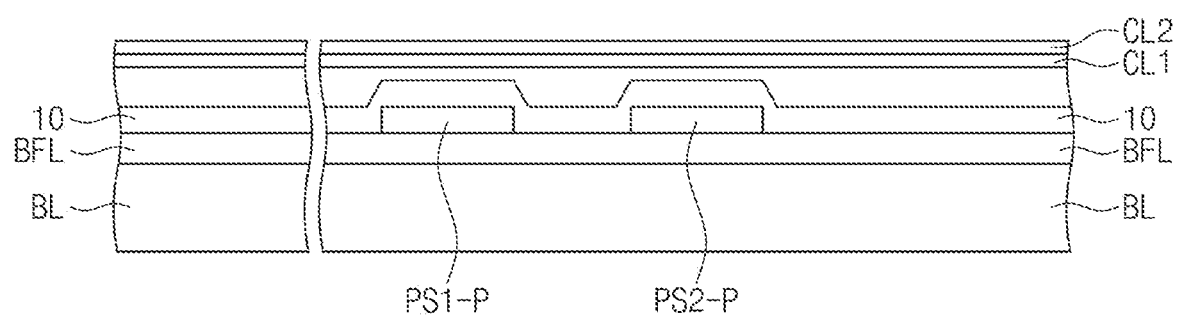

Subsequently, as illustrated in FIG. 5B, a first layer CL1 and a second layer CL2 are continuously formed on the first insulating layer 10. The first layer CL1 is formed by depositing aluminum. The first layer CL1 may be formed by co-depositing aluminum, nickel, and lanthanum.

The second layer CL2 may be formed by depositing niobium. A deposition process of niobium may be performed through plasma deposition. It is desirable that the plasma deposition is performed under deposition conditions with a chamber pressure of 0.16 Pa from 0.2 Pa and a power density of 2.68 W/cm$^2$ from 3.13 W/cm$^2$. When the deposition is performed under the conditions described above, a resistance value of the signal line CL (see FIG. 4A) is small, and deviation thereof is small. This is because the density of the niobium layer is high, and roughness of the niobium layer is low.

Figure 5C:
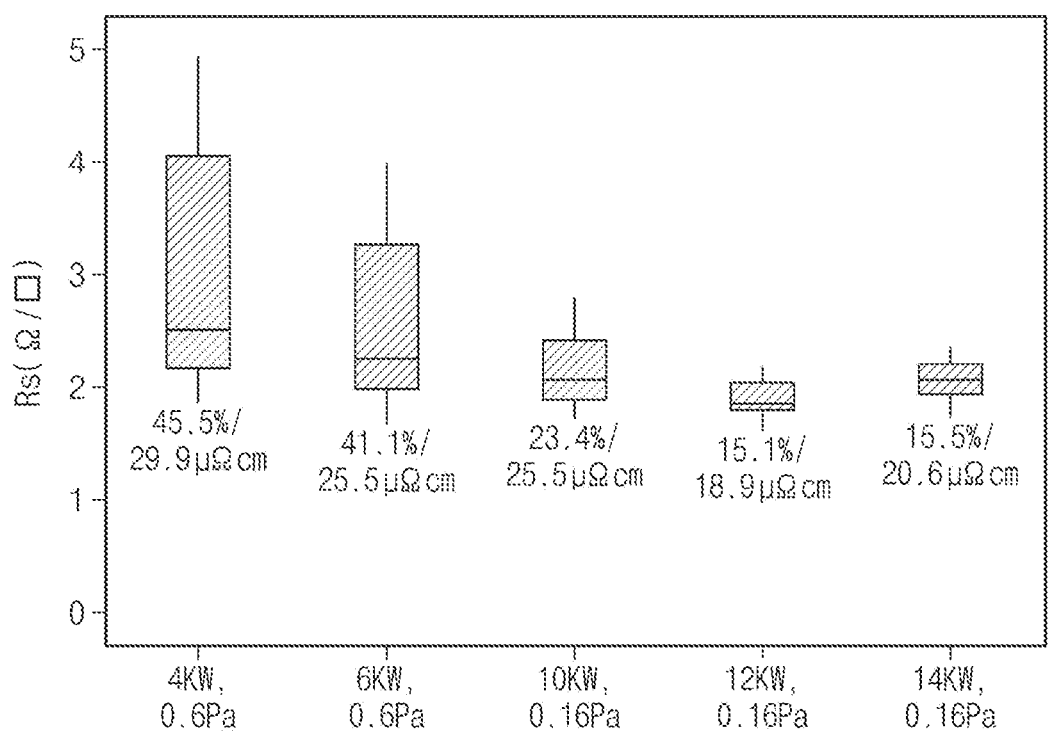
FIG. 5C is a bar graph illustrating a change in resistance due to deposition conditions of a second layer of the signal line according to an embodiment of the present invention.

FIG. 5C shows specific resistance values of the signal line CL (see FIG. 4A) according to deposition conditions of the second layer CL2. It may be found that the niobium layer when deposition is performed at a power of 12 KW has a low specific resistance value, and deviation (dispersion) of specific resistance values is small. For reference, a power of 12 KW is converted into a power density of 2.68 W/cm$^2$.

Figure 5D:
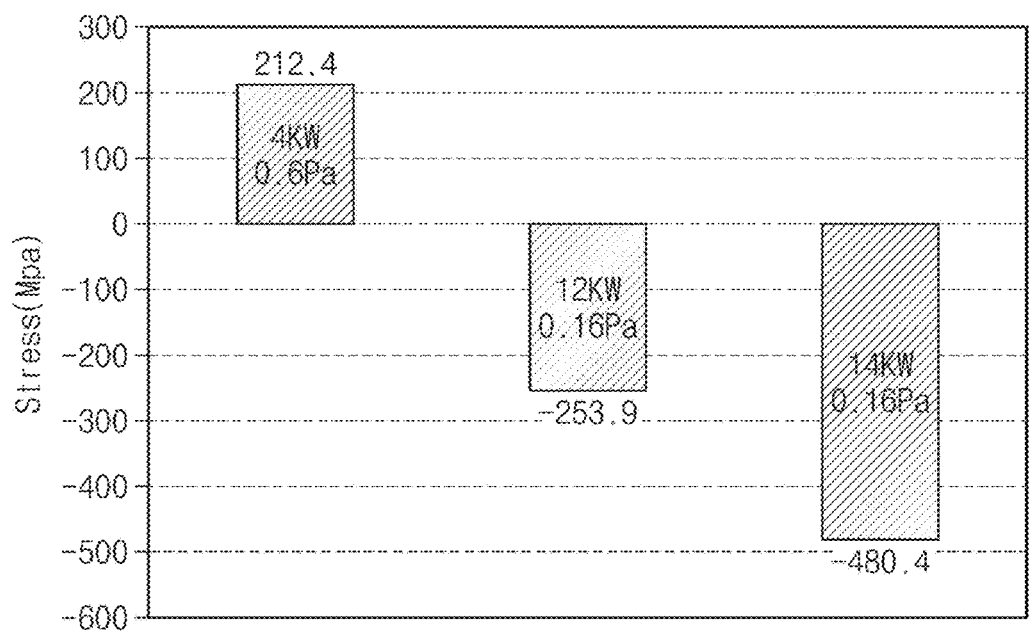
FIG. 5D is a bar graph illustrating a change in stress due to deposition conditions of the second layer of the signal line according to an embodiment of the present invention.
Figure 5E:
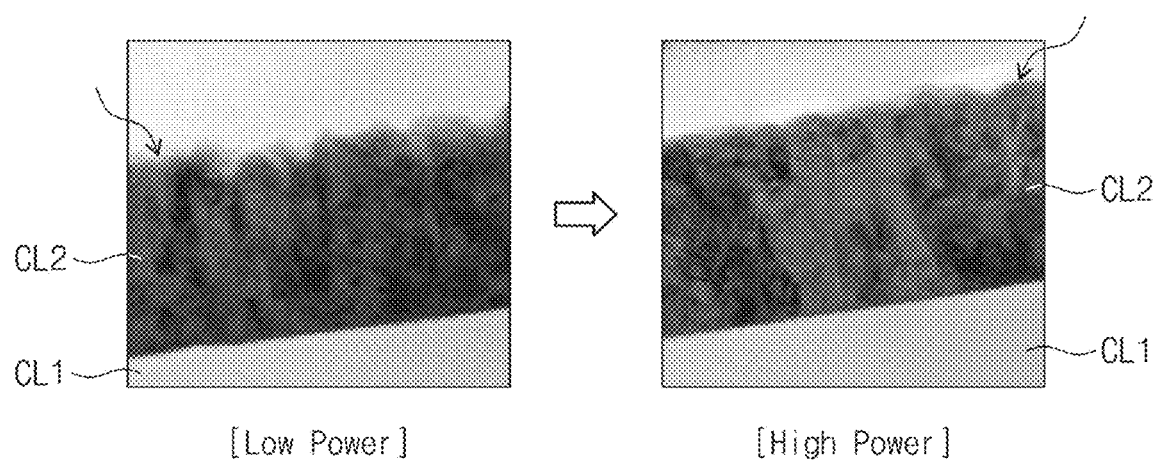
FIG. 5E is a picture illustrating a portion of a cross-section of a signal according to an embodiment of the present invention.

In FIG. 5D, stress of the niobium layer is measured. When density of the niobium layer is high, tensile stress is applied. The stress generated in the signal line deposited in the range of the plasma deposition conditions is measured from −250 Mpa to −480 Mpa. Referring to a portion indicated by an arrow in FIG. 5E, it is found that a niobium layer when deposition is performed at high power density has lower roughness than a niobium layer when deposition is performed at low power density.

Figure 5F:
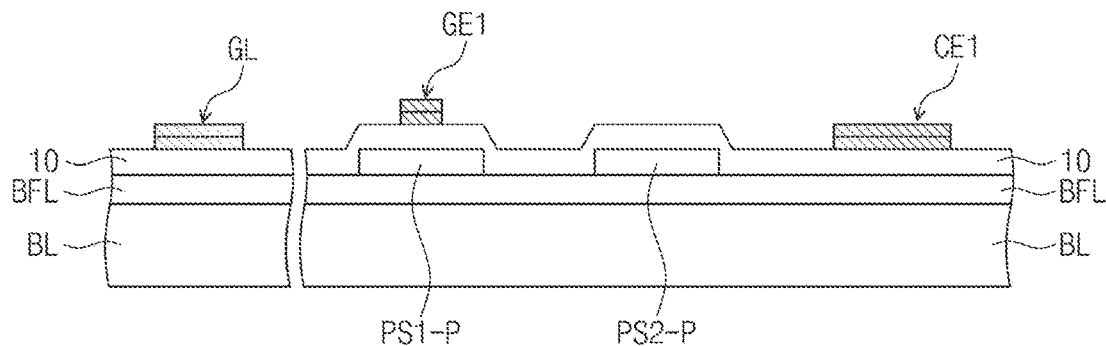
FIGS. 5F to 5J are cross-sectional views illustrating a method of manufacturing a display panel according to an embodiment of the present invention.

Subsequently, as illustrated in FIG. 5F, the first layer CL1 and the second layer CL2 are patterned. A first control electrode GE1 and a first electrode CE1 are formed by patterning the first layer CL1 and the second layer CL2. A general wet etching method or dry etching method may be used.

Figure 5G:
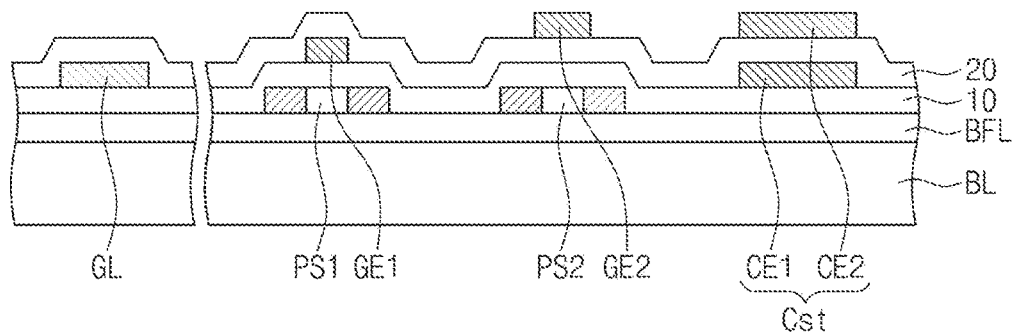

Subsequently, as illustrated in FIG. 5G, a second insulating layer 20 is formed on the first insulating layer 10. The second insulating layer 20 may be formed through deposition, coating, or printing. Next, a second control electrode GE2 and a second electrode CE2 are formed on the second insulating layer 20. The second control electrode GE2 and the second electrode CE2 may have a single-layer or multi-layered structure. The second control electrode GE2 and the second electrode CE2 having a two-layer structure may be formed through the processes of FIGS. 5B to 5F.

Next, the first preliminary semiconductor pattern PS1-P and the second preliminary semiconductor pattern PS2-P may be doped using the first control electrode GE1 and the second control electrode GE2 as masks. An area (hereinafter, referred to as a channel area) overlapping each of the first control electrode GE1 and the second control electrode GE2 is not doped, and areas (an input area and an output area) on both sides of the channel area are doped. In the illustrated embodiment, the doping is made by using an n-type dopant, that is, a pentavalent element.

Subsequently, a heat treatment process may be performed. A first semiconductor pattern PS1 and a second semiconductor pattern PS2 are heat-treated at about 400° C. to about 500° C., for example, 450° C., The dopants may be uniformly diffused in the input area and the output area by the heat treatment. As described above, the conductive patterns including the niobium layer may prevent the hillock phenomenon of the aluminum layer even though the high-temperature heat treatment process is performed.

Figure 5H:
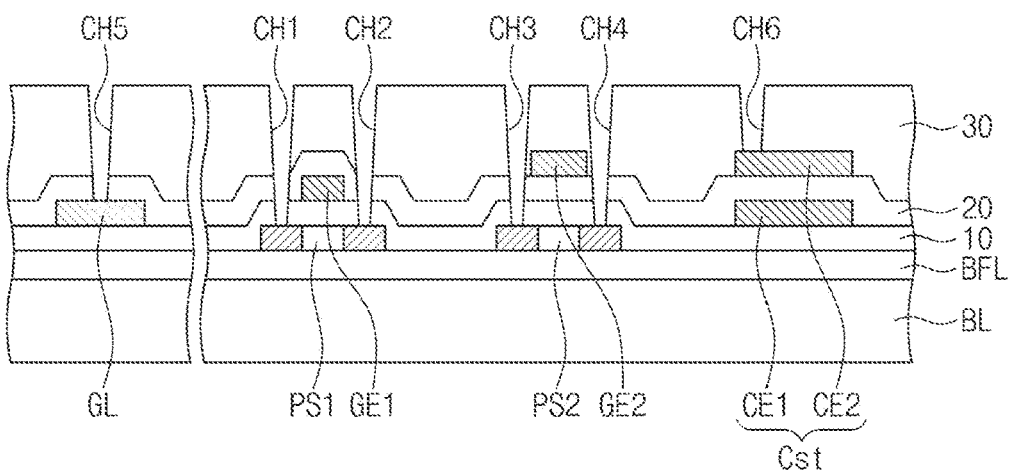

Next, as illustrated in FIG. 5H, a third insulation layer 30 is formed on the second insulation layer 20. The third insulating layer 30 may be formed through deposition, coating, or printing. Subsequently, first to six through-holes CH1 to CH6 may be formed. Here, portions of areas of the first semiconductor pattern PS1 and the second semiconductor pattern PS2 exposed through the first to fourth through-holes CH1 to CH4 may be oxidized. A cleaning process may be performed to reduce contact resistance of the first semiconductor pattern PS1 and the second semiconductor pattern PS2. The cleaning solution removes a silicon dioxide formed around the first to fourth through-holes CH1 to CH4.

The cleaning solution may permeate into the fifth and sixth through-holes CH5 and CH6, and the niobium layer may prevent the cleaning solution from reacting with the aluminum layer. The niobium layer may prevent a specific component of the cleaning solution, for example, fluoride (HF) from damaging the aluminum layer.

Figure 5I:
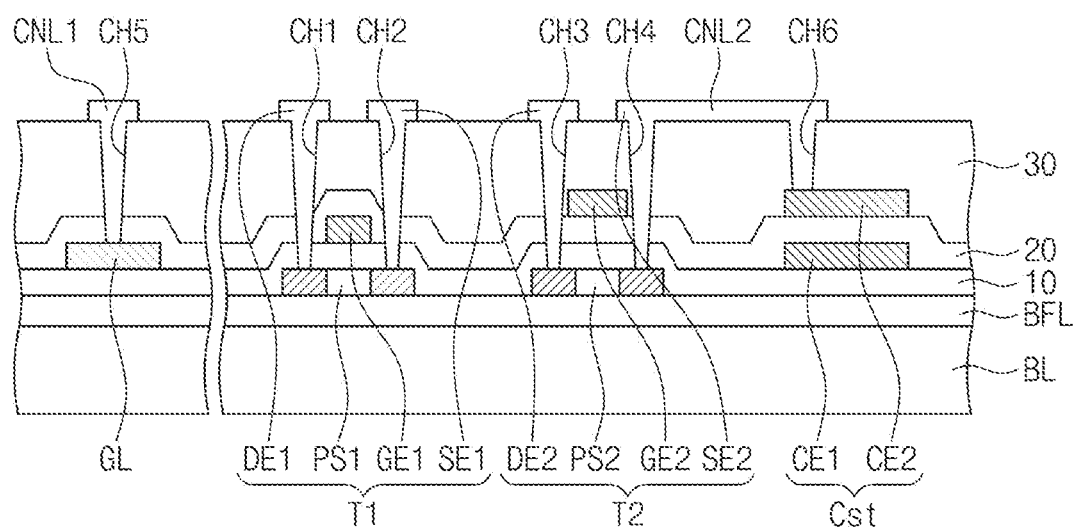

Hereinafter, as illustrated in FIG. 5I, conductive patterns are formed on the third insulating layer 30 through a deposition process. A first input electrode DE1, a first output electrode SE1, a second input electrode DE2, a second output electrode SE2, a first connection signal line CNL1, and a second connection signal line CNL2 may be formed. Theses conductive patterns may have a three-layer structure of Ti/Al/Ti.

Figure 5J:
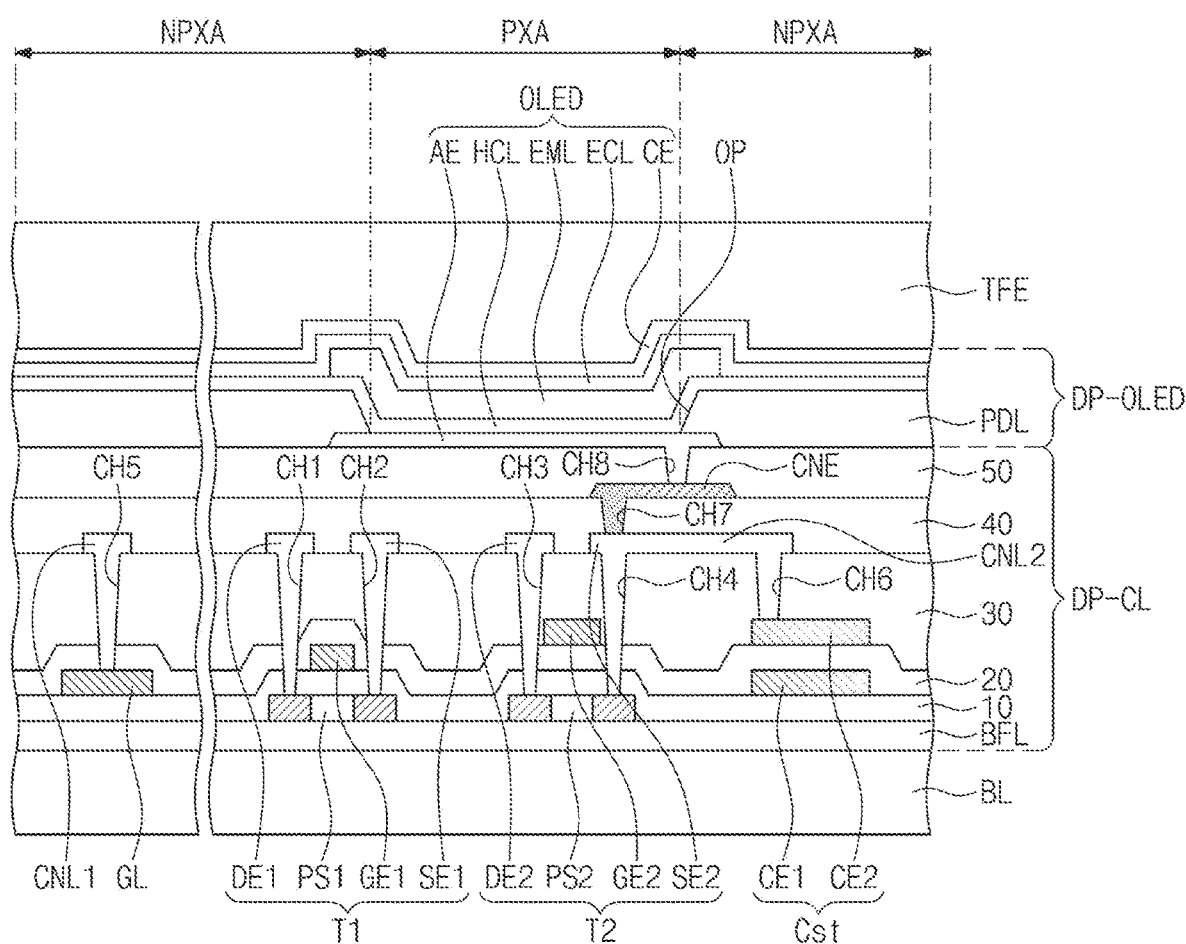

Hereinafter, as illustrated in FIG. 5J, subsequent processes are performed to complete the display panel. A fourth insulating layer 40 is formed, and a seventh contact hole CH7 is formed. A connection electrode CNE is formed on the fourth insulating layer 40. A fifth insulating layer 50 is formed, and an eighth contact hole CH8 is formed. Next, an organic light emitting diode OLED is formed on the fifth insulating layer 50.

On the fifth insulating layer 50, an anode AE is formed which is connected to the connection electrode CNE through the eighth contact hole CH8. On the first insulating layer 50, a pixel defining layer PDL is formed which exposes a central portion of the anode AE.

Subsequently, a hole control layer HCL, a light emitting layer EML, an electron control layer ECL, and a cathode CE are sequentially formed. A thin film encapsulation layer TFE is formed on the cathode CE. An encapsulation organic layer and/or an encapsulation inorganic layer are formed through deposition, an inkjet printing process, and/or the like.

Although described with reference to exemplary embodiments of the present invention, it will be understood that various changes and modifications of the present invention may be made by one ordinary skilled in the art or one having ordinary knowledge in the art without departing from the spirit and technical field of the present invention as hereinafter claimed.

Hence, the technical scope of the present invention Is not limited to the detailed descriptions in the specification but should be determined only with reference to the claims.

INDUSTRIAL APPLICABILITY

In a display panel, a signal transmission speed has an effect on display quality. Recently, high-resolution display panels have been widely developed. In the high-resolution display panels, the signal transmission speed becomes more important factor. Thus, the present application relating to a wire structure to improve the signal transmission speed has high industrial applicability.

The invention claimed is:

1. A display panel comprising:
   a base layer;
   a signal line on the base layer and comprising
      a first layer comprising aluminum, and
      a second layer directly on the first layer and consisting of niobium;
   a first thin film transistor connected to the signal line;
   a second thin film transistor on the base layer;
   a capacitor electrically connected to the second thin film transistor; and
   a light emitting element electrically connected to the second thin film transistor.

2. The display panel of claim 1, wherein the first thin film transistor comprises:
   a first polysilicon semiconductor on the base layer;
   a first control electrode overlapping the first polysilicon semiconductor and connected to the signal line; and
   a first input electrode and a first output electrode, each connected to the first polysilicon semiconductor.

3. The display panel of claim 2, wherein the first control electrode has the same stacked structure as the signal line.

4. The display panel of claim 2, wherein the second thin film transistor comprises:
   a second polysilicon semiconductor on the base layer;
   a second control electrode overlapping the second polysilicon semiconductor and on a different layer than the first control electrode; and
   a second input electrode and a second output electrode, each connected to the second polysilicon semiconductor.

5. The display panel of claim 4, wherein the capacitor comprises a first electrode on the same layer as the signal line and a second electrode on the same layer as the second control electrode, and
wherein the first electrode has the same stacked structure as the signal line.

6. The display panel of claim 5, wherein each of the second control electrode and the second electrode comprises
a first layer comprising aluminum, and
a second layer directly on the first layer and consisting of niobium.

7. The display panel of claim 1, wherein the first layer comprises an aluminum (Al)-nickel (Ni)-lanthanum (La) alloy.

8. The display panel of claim 7, wherein a content of the nickel in the first layer is 0.01 at % to 0.05 at %, and a content of the lanthanum in the first layer is 0.02 at % to 0.05 at %.

9. The display panel of claim 1, wherein a line width of the signal line is 3 μm to 5 μm.

10. The display panel of claim 1, wherein a thickness of the first layer is 1000 Å to 2000 Å, and a thickness of the second layer is 200 Å to 600 Å.

11. The display panel of claim 1, wherein stress generated in the signal line is −250 Mpa to −480 Mpa.

12. The display panel of claim 1, wherein the signal line is configured to provide a turn-on signal to the first thin film transistor.

13. A display panel comprising:
a base layer;
a first thin film transistor on the base layer;
a second thin film transistor electrically connected to the first thin film transistor; and
a light emitting element connected to the second thin film transistor,
wherein the first thin film transistor comprises:
a first polysilicon semiconductor on the base layer;
a first control electrode overlapping the first polysilicon semiconductor and comprising a first layer comprising an aluminum (Al)-nickel (Ni)-lanthanum (La) alloy and a second layer directly on the first layer and consisting of niobium; and
a first input electrode and a first output electrode, each connected to the first polysilicon semiconductor.

14. A method for manufacturing a display panel, the method comprising:
forming a semiconductor pattern on a base layer;
forming a signal line on the base layer;
forming, on the base layer, a control electrode overlapping the semiconductor pattern;
forming, on the base layer, an input electrode and an output electrode which are connected to the semiconductor pattern; and
forming a light emitting element on the base layer,
wherein the forming of the signal line comprises:
forming a first layer comprising aluminum;
forming, directly on the first layer, a second layer consisting of niobium; and
patterning the first layer and the second layer.

15. The method of claim 14, wherein the first layer comprises an aluminum (Al)-nickel (Ni)-lanthanum (La) alloy.

16. The method of claim 15, wherein a content of the nickel in the first layer is 0.01 at % to 0.05 at %, and a content of the lanthanum in the first layer is 0.02 at % to 0.05 at %.

17. The method of claim 14,
wherein the semiconductor pattern comprises a polysilicon semiconductor, and
the method further comprises doping an area of the polysilicon semiconductor, which does not overlap the control electrode, with an impurity.

18. The method of claim 17, further comprising annealing the polysilicon semiconductor at 400° C. or higher.

19. The method of claim 17, further comprising:
forming, on the base layer, an insulating layer configured to cover the polysilicon semiconductor;
forming, in the insulating layer, a through-hole that exposes the area of the polysilicon semiconductor which does not overlap the control electrode; and
cleaning the area of the polysilicon semiconductor exposed by the through-hole.

20. The method of claim 14, wherein the forming of the second layer is performed through plasma deposition, and the plasma deposition is performed under deposition conditions with a chamber pressure of 0.16 Pa to 0.2 Pa and a power density of 2.68 W/cm$^2$ to 3.13 W/cm$^2$.

* * * * *